United States Patent [19]

Hirao

[11] Patent Number: 4,651,016

[45] Date of Patent: Mar. 17, 1987

[54] SOLID-STATE IMAGE SENSOR PROVIDED WITH A BIPOLAR TRANSISTOR AND AN MOS TRANSISTOR

[75] Inventor: Tadashi Hirao, Itami, Japan

[73] Assignee: Mitsubishi Denki Kabushiki Kaisha, Tokyo, Japan

[21] Appl. No.: 620,704

[22] Filed: Jun. 14, 1984

[30] Foreign Application Priority Data

Jul. 28, 1983 [JP] Japan ............................ 58-139756

[51] Int. Cl.$^4$ ............................................ H01J 40/14
[52] U.S. Cl. ................................. 250/578; 250/211 J; 357/30
[58] Field of Search ............... 250/211 J, 578; 357/30, 357/32; 358/213

[56] References Cited

U.S. PATENT DOCUMENTS 4,407,010 9/1983 Baji et al. .................... 250/211 J X

OTHER PUBLICATIONS

"Integrated Arrays of Silicon Photodetectors for Image Sensing," by Dyck et al.

Primary Examiner—Eugene R. LaRoche
Assistant Examiner—James C. Lee
Attorney, Agent, or Firm—Lowe Price LeBlanc Becker & Shur

[57] ABSTRACT

A signal photoelectrically transduced by a photodiode PD is amplified by a transistor $TR_A$ and then read out by a MOS transistor $TR_S$.

8 Claims, 5 Drawing Figures

PRIOR ART FIG. 1
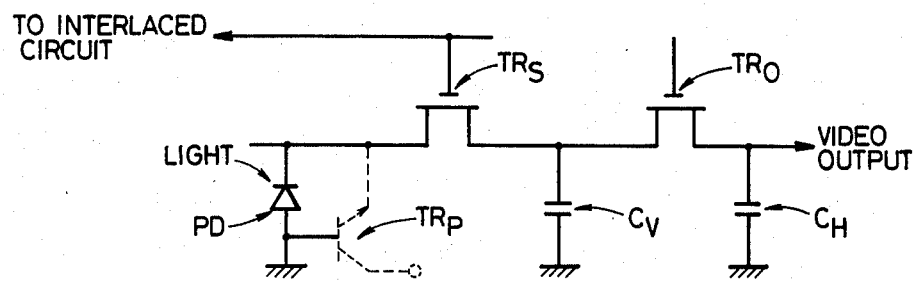
PRIOR ART FIG. 2
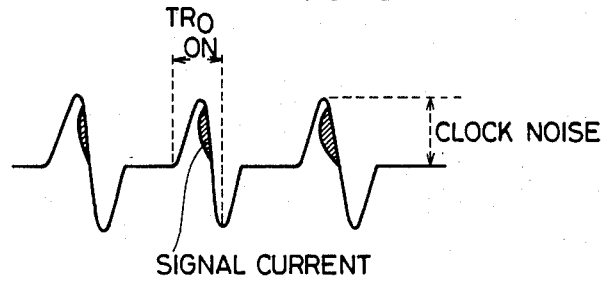
PRIOR ART FIG. 3
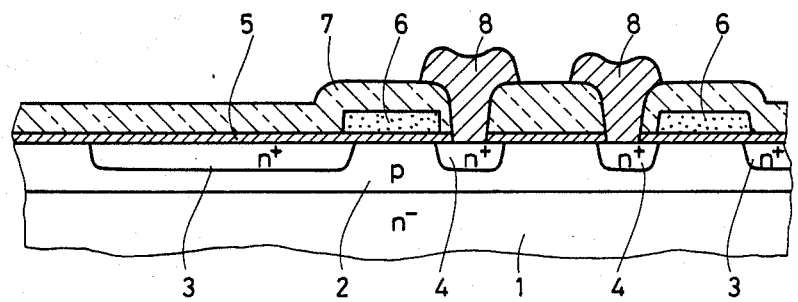

SOLID-STATE IMAGE SENSOR PROVIDED WITH A BIPOLAR TRANSISTOR AND AN MOS TRANSISTOR

BACKGROUND OF THE INVENTION

1. Field of the Invention

The present invention relates to an improvement of the structure of a solid-state (semiconductor) image sensor.

2. Description of the Prior Art

Conventionally, semiconductor image sensors (referred to hereinafter as SIS) were limited to a MOS type and a CCD type. FIG. 1 shows an equivalent circuit and a reading transistor circuit connected thereto for a fundamental cell (referred to hereinafter simply as a cell) constituting a picture element of a MOS type SIS currently placed on the market. Referring to FIG. 1, a cell is structured by a photodiode PD and a MOS switching transistor $TR_S$. A charge generated by transducing at the time of application of light to the photodiode PD is stored in a connection capacitance $C_V$ when the transistor $TR_S$ is turned on and then the charge moves to a capacitance $C_H$ when the reading MOS transistor $TR_O$ is turned on, so that the voltage therein becomes a video output. In this case, since the capacitance $C_V$ is as small as 1/100 of the capacitance $C_H$ or less, the signal current becomes a minor current superimposed on the clock noise, as shown in FIG. 2. Accordingly, the dynamic range of the video output is considerably limited and therefore it is necessary to make the photoelectric transducing current sufficiently large by making the light receiving area of the photodiode PD large, thereby to enhance the SIS sensitivity.

FIG. 3 is a sectional view partially showing a cell of a MOS type SIS and the adjacent cells on both sides thereof. In FIG. 3, a p type well 2 serving also as an anode of a photodiode PD is formed on an n⁻ type substrate 1. An n⁺ layer 3 is formed selectively on the surface of the p type well 2 and serves as a cathode of the photodiode PD and also as a source of the MOS switching transistor $TR_S$. An n⁺ layer 4 is formed in P type well 2 so as to provide a channel forming region between this layer 4 and the n⁺ layer 3. This layer 4 becomes a drain of the MOS switching transistor $TR_S$. An oxide film 5 is formed over the p type well 2 including the n⁺ layers 3 and 4. A gate electrode 6 made of polycrystal silicon is formed on the portion of the gate oxide film 5 which is over the channel forming region of the MOS switching transistor $TR_S$. An inter-layer insulating film 7 is formed over the oxide film 5 and the gate electrode 6. In addition, a drain electrode 8 is fixed to the n⁺ type layer 4 through an opening formed in the oxide film 5 and the inter-layer insulating film 7. The gate electrode 6 is connected to an interlaced circuit (not shown) and the drain electrode 8 is connected to the reading MOS transistor $TR_O$. A transistor $TR_P$ (shown by the dotted lines in FIG. 1) formed by the n⁺ layer 3, the p type well 2 and the n⁻ type substrate 1 in the photodiode PD serves to absorb the excess current due to the excessively saturated light.

In order to make the above described MOS type SIS have a high sensitivity, an increase of the area of the n⁺ diffusion layer 3 serving as a cathode for the photodiode PD as described above may be considered. However, since the area of application of light to the SIS is determined by an optical system such as a lens etc., the call area is necessarily limited in case where the number of picture elements (i.e. the number of cells) is fixed to a certain value and therefore it is impossible to enlarge the area for cathode arbitrarily. Then, another approach may be considered in which the sensitivity is to be improved by amplifying the photoelectrically transduced signal provided from the SIS. However, in this case, the clock noise of the reading clock and the fixed pattern noise are also amplified and as a result the sensitivity cannot be improved.

SUMMARY OF THE INVENTION

An object of the present invention is to provide a solid-state image sensor which makes it possible to improve the sensitivity without lowering the S/N ratio of the photoelectric transducing current.

Briefly stated, the present invention includes an amplifying transistor interposed between a photoelectric transducing portion and a signal reading means, so that a photoelectrically transduced signal read out from the photoelectric transducing portion is amplified by this amplifying transistor and then applied to the signal reading means.

According to the present invention, there is provided an amplifying transistor which directly receives and amplifies a photoelectrically transduced signal provided from a photoelectric transducing portion, which makes it possible to amplify a photoelectrically transduced signal and to improve the sensitivity without lowering the S/N ratio. In addition, as a result of the improvement of the sensitivity, the photoelectric transducing portion can be made smaller and the integration degree can be enhanced.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a view showing an equivalent circuit of a conventional MOS type SIS.

FIG. 2 is a time chart of the photoelectric transducing current outputted from the SIS shown in FIG. 1.

FIG. 3 is a sectional view of a conventional MOS type SIS.

DESCRIPTION OF THE PREFERRED EMBODIMENT

Figure 4:
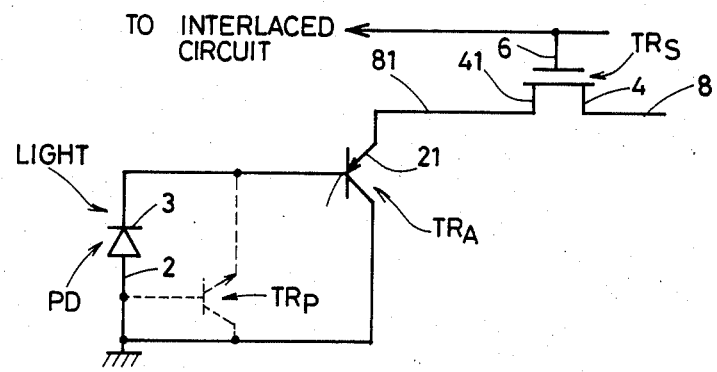
FIG. 4 is a view showing an equivalent circuit in accordance with an embodiment of the present invention.

FIG. 4 is a view showing an equivalent circuit of an embodiment of the present invention. This embodiment in FIG. 4 is the same as the circuit in FIG. 1 except for the following points. Specifically, one feature of this embodiment resides in that an amplifying transistor $TR_A$ is provided between a photodiode PD and a MOS switching transistor $TR_S$. A base of this amplifying transistor $TR_A$ is connected to a cathode 3 of the photodiode PD. On the other hand, a collector of the amplifying transistor $TR_A$ is connected to an anode 2 of the photodiode PD and the connecting point is grounded. In addition, an emitter 21 of the amplifying transistor $TR_A$ is connected to a source 41 of the MOS switching trnasistor $TR_S$. A gate 6 of the MOS switching transistor TR$_S$ is connected to an interlaced circuit, not shown, in the same manner as in the circuit in FIG. 1. A drain 4 is connected to a reading MOS transistor TR$_O$ (not shown in FIG. 4, although the corresponding transistor is shown in FIG. 1).

Figure 5:
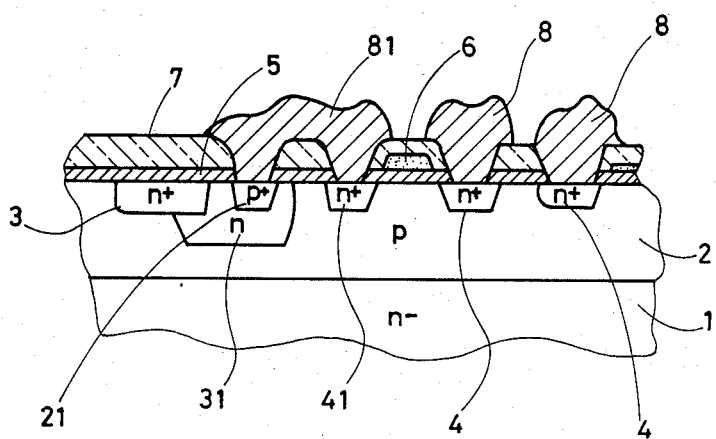
FIG. 5 is a sectional view of a solid-state image sensor shown in the equivalent circuit in FIG. 4.

FIG. 5 is a sectional view of a solid-state image sensor shown in FIG. 4. In FIG. 5, the same portions as in FIG. 3 are denoted by the same reference numerals, detailed description thereof being omitted. As described above, the amplifying transistor TR$_A$ is provided between the photodiode PD and the MOS switching transistor TR$_S$. In order to form this amplifying transistor TR$_A$, an n layer 31 of low concentration is formed in the p layer 2 which serves as the anode of the photodiode PD. This n layer 31 is formed so that a portion thereof is connected in a plane manner to an n+ layer 3 which serves as the cathode 3 of the photodiode PD. In this n layer 31, a p+ layer 21 of high concentration is formed. The P+ layer 21 and the n layer 31 as well as the p layer 2 constitute a so-called vertical pnp transistor (an amplifying transistor TR$_A$). The p+ layer 21 becomes an emitter of this pnp transistor, the n layer 31 becomes a base and the p layer 2 becomes a collector. The p+ layer 21 and the n+ layer 41 which serves as a source of the MOS switching transistor TR$_S$ are connected by a low resistance metal 81.

In a structure as described above, when an optical signal is applied to the cathode 3 of the photodiode PD, hole-electron pairs are generated and electrons are stored in a depletion layer in proportion to the optical signal. The stored charge as the photoelectric transduced signal is injected into the base 31 of the amplifying transistor TRA. The generated holes are not injected at this time as the condition of the holes is different from the electrons, because of the difference in the lifetime and the mobility of holes and electrons. Thus, the holes are trapped halfway. When the MOS switching transistor TR$_S$ is turned on, the amplifying transistor TR$_A$ is also turned on. Now, assuming that the current amplification factor of the amplifying transistor TR$_A$ is $\beta$, the amplifying transistor TR$_A$ absorbs, from the MOS switching transistor TR$_S$, the current which is $\beta$ times as large as the charge injected in the base 31. Accordingly, a photoelectrically transduced signal $\beta$ times as large as the charge stored in the photodiode PD flows in the drain electrode 8 of the MOS switching transistor TR$_S$.

Thus, in the above described embodiment, the photoelectrically transduced signal read out from the photodiode PD is amplified by the amplifying transistor TR$_A$ before it is supplied to the MOS switching transistor TR$_S$ and as a result, the photoelectrically transduced signal, on which noise or the like is not superimposed, can be amplified above. Therefore, the sensitivity can be improved without lowering the S/N ratio.

Since a pnp transistor is used as the amplifying transistor TR$_A$ in the above described embodiment, the charge storing effect on the photodiode PD and thus its performance as a sensor, can be heightened as compared with use of an NPN transistor.

In addition, since the amplifying transistor TR$_A$ is of vertical structure in the above described embodiment, a transistor having a high current amplification factor $\beta$ can be easily realized with high precision. In a transistor of lateral structure, as is well known, it is difficult to make the current amplification factor $\beta$ large ($\beta$ is approximately 2 to 5) and dependent on the precision of the photolithography, the base width changes and the value of $\beta$ varies irregularly.

As for the integration density, although space is needed for forming the amplifying transistor TR$_A$, the integration density can be further improved without lowering the sensitivity since, if the current amplification factor $\beta$ is approximately 10 for example, the sensitivity can be enhanced approximately by a factor of two even if the n+ layer 3 of the photodiode PD is reduced to 1/5 of that in a conventional type. For example, conventionally, in a photo diode having a cell of 3000 $\mu m^2$ of a MOS type SIS and an opening proportion of 30%, the n+ layer serving as a cathode was approximately 100 $\mu m^2$. If an amplifying transistor of $\beta = 10$ is formed in such a cell, only, 20 $\mu$ (1/5 the conventional area) m$^2$ is needed for the n+ layer of a photodiode and it is easy to provide an amplifying transistor in the remaining area of 20 $\mu m^2$ if the amplifying transistor is of vertical structure.

With respect to the excessively saturated light, the excess current can be absorbed by the transistor TR$_P$ shown by the dotted lines in FIG. 4, in the same manner as in a conventional type, whereby blooming can be prevented.

Although in the above described embodiment, a MOS type SIS was used, it goes without saying that the present invention can also be applied to a CCD type SIS in which a CCD (charge coupled device) is used instead of the MOS switching transistor TR$_S$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A solid-state image sensor comprising:
   a photoelectric transducing portion in which a charge is stored according to incident light, including an n+-p photodiode;
   signal reading means for reading the charge stored in said photoelectric transducing portion as a photoelectrically transduced signal, and
   a pnp amplifying transistor interposed between said photoelectric transducing portion and said signal reading means for receiving directly a photoelectrically transduced signal read out from said photoelectric transducing portion so as to amplify said photoelectrically transduced signal,
   said amplifying transistor having a base connected to a cathode of said n+-p photodiode, a collector connected to an anode of said n+-p photodiode and an emitter connected to said signal reading means.
2. A solid-state image sensor in accordance with claim 1, wherein said PNP amplifying transistor is a transistor of vertical structure.
3. A solid-state image sensor as recited in claim 1 wherein said collector of said pnp amplifying transistor and the anode of said photodiode are formed in a common p-type layer.
4. A solid-state image sensor as recited in claim 2 wherein said collector of said pnp amplifying transistor and the anode of said photodiode are formed in a common p-type layer.
5. A solid-state image sensor as recited in claim 1 wherein the base of said amplifying pnp transistor comprises an n-type region abutting the n+ cathode region of the photodiode.

6. A solid-state image sensor as recited in claim 4 wherein the base of said amplifying pnp transistor comprises an n-type region abutting the n+ cathode rtion of the photodiode.

7. A solid-state image senor as recited in claim 1 wherein said signal reading means comprises an n-type region to which the p-type emitter region of the pnp amplifying transistor is connected by a metallic portion.

8. A solid-state image sensor as recited in claim 6 wherein said signal reading means comprises an n-type region to which the p-type emitter region of the pnp amplifying transistor is connected by a metallic portion.

* * * * *